United States Patent
Mazzocchi et al.

(10) Patent No.: US 11,424,121 B2
(45) Date of Patent: Aug. 23, 2022

(54) METHOD FOR FORMING A LAYER BY CYCLIC EPITAXY

(71) Applicant: COMMISSARIAT A L'ENERGIE ATOMIQUE ET AUX ENERGIES ALTERNATIVES, Paris (FR)

(72) Inventors: Vincent Mazzocchi, Grenoble (FR); Sylvain Maitrejean, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/126,116

(22) Filed: Dec. 18, 2020

(65) Prior Publication Data

US 2021/0210345 A1  Jul. 8, 2021

(30) Foreign Application Priority Data

Dec. 18, 2019 (FR) ..................... 19 14803

(51) Int. Cl.
*H01L 21/02* (2006.01)
*H01L 21/306* (2006.01)
*H01L 21/78* (2006.01)

(52) U.S. Cl.
CPC .... *H01L 21/02513* (2013.01); *H01L 21/0257* (2013.01); *H01L 21/30604* (2013.01); *H01L 21/7813* (2013.01)

(58) Field of Classification Search
None
See application file for complete search history.

(56) References Cited

U.S. PATENT DOCUMENTS

| | | |
|---|---|---|
| 2006/0115934 A1 | 6/2006 | Kim et al. |
| 2006/0216876 A1 | 9/2006 | Kim et al. |
| 2007/0207596 A1 | 9/2007 | Kim et al. |
| 2007/0254451 A1 | 11/2007 | Dutartre et al. |
| 2007/0287272 A1 | 12/2007 | Bauer et al. |
| 2012/0244688 A1 | 9/2012 | Bauer et al. |
| 2012/0252174 A1 | 10/2012 | Dutartre et al. |

OTHER PUBLICATIONS

French Preliminary Search Report dated Aug. 24, 2020 in French Application 19 14803 filed on Dec. 18, 2019 (with English Translation of Categories of Cited Documents & Written Opinion), 10 pages.

*Primary Examiner* — Alexander G Ghyka
(74) *Attorney, Agent, or Firm* — Oblon, McClelland, Maier & Neustadt, L.L.P.

(57) ABSTRACT

A method for forming a layer by cycled epitaxy includes at least one sequence of steps each having a first epitaxial deposition forming a first growth layer portion having a first thickness on a first monocrystalline pattern and a second growth layer portion having a second thickness on a second non-monocrystalline pattern, the second thickness being greater than the first thickness, and a second epitaxial deposition forming a first sacrificial layer portion having a third thickness on the first growth layer portion and a second sacrificial layer portion having a fourth thickness on the second growth layer portion. The first and second growth layer portions have an additional element content, greater than the additional element content present in the first and second sacrificial layer portions. The sequence also includes etching the whole of the third and fourth thicknesses and stopping before having consumed the whole of the first thickness.

21 Claims, 8 Drawing Sheets

METHOD FOR FORMING A LAYER BY CYCLIC EPITAXY

TECHNICAL FIELD

The invention generally relates to the field of epitaxial deposition methods. It has a particularly advantageous application in the field of cycled epitaxial deposition methods, in order to form an epitaxial layer on a monocrystalline pattern of a wafer, without forming any layer on another pattern of the wafer, this other pattern not being monocrystalline.

STATE OF THE ART

The production of numerous microelectronic devices requires epitaxially depositing a layer on monocrystalline patterns of a wafer without depositing this layer on non-monocrystalline patterns of this wafer.

Typically, it can be necessary to epitaxially deposit a silicon-based layer on monocrystalline patterns, without depositing layers on non-monocrystalline patterns, such as amorphous patterns, formed of an oxide or of a nitride, for example.

A solution to achieve this consists of carrying out a cycled epitaxy. A cycled epitaxy consists of repeating sequences of steps, each comprising an epitaxial deposition step followed by a selective etching step allowing to preferably etch the layer deposited on the non-monocrystalline pattern with respect to the epitaxial material on the monocrystalline pattern.

After several sequences, it is possible to obtain an epitaxial layer of desired thickness on the monocrystalline patterns while conserving the discovered non-crystalline patterns.

In certain cases, this cycled epitaxial solution has not proved to be effective. This is particularly the case when the deposition speeds are greater on the amorphous pattern than on the monocrystalline pattern.

There is therefore a need to form, from an epitaxial deposition, a layer on the monocrystalline patterns of a wafer without forming this layer on other non-monocrystalline patterns of the wafer.

The other aims, features and advantages of the present invention will appear upon examining the following description and supporting drawings. It is understood that other advantages can be incorporated.

SUMMARY

To achieve this aim, according to an embodiment of the present invention, a method for forming a layer by cycled epitaxy is provided, comprising at least and possibly only the following steps:
providing a wafer comprising at least one first monocrystalline pattern and at least one second pattern taken from among an amorphous pattern or a polycrystalline pattern,
carrying out at least one sequence of steps each comprising at least the following successive steps:
first deposition, preferably by epitaxy, so as to form:
a first growth layer portion formed by epitaxy on the first pattern and having a thickness $e_{110}$ and
a second growth layer portion formed on the second pattern and having a thickness $e_{210}$
at least due to the difference of the crystalline structure between the first and second patterns, coming from the first deposition, the thicknesses $e_{210}$ and $e_{110}$ are such that $e_{210} > e_{110}$.

The first deposition being carried out from a first chemistry comprising a first semi-conductive species and an additional species having a first content t1 in the first chemistry.
second deposition, preferably by epitaxy, so as to form:
a first sacrificial layer portion formed by epitaxy on the first growth layer portion and having a thickness $e_{120}$ and
a second sacrificial layer portion formed on the second growth layer portion and having a thickness $e_{220}$.

The second deposition is carried out from a second chemistry comprising a second semi-conductive species and having a second content t2 in said additional species t2 is such that $0 \leq t2 < t1$.
etching of the whole thickness $e_{220}$ of the second sacrificial layer portion, of at least one portion and preferably the whole thickness $e_{120}$ of the first sacrificial layer portion and of all or some of the thickness $e_{210}$ of the second growth layer portion with a stop of the etching before having consumed all or some of the thickness $e_{110}$ of the first growth layer portion.

In the scope of development of the present invention, it is proved that the etching speeds highly fluctuate according to the crystallographic structure of the deposited layer, as well as the concentration in the additional species in this layer, typically at the doping level of the deposited layer.

In particular, it has been observed that:
the etching speed difference between monocrystalline portions and non-monocrystalline portion is very significant for semi-conductive layers having a zero or very low doping level, the etching speed on the non-monocrystalline portions being greater. However, this difference tends to decrease when the doping level increases.
the growth speed on the monocrystalline portions is always lower than on the non-monocrystalline portions.

The method proposed benefits from these observations. Thus, even if the first deposition forms a growth layer thicker on the non-monocrystalline portions than on the monocrystalline portions, the high etching difference between the sacrificial layer of the monocrystalline portion and the sacrificial layer of the non-monocrystalline portion allows to consume all of the depositions formed on the non-monocrystalline portions while conserving at least one portion of the growth layer deposited on the monocrystalline portion.

The method proposed thus allows to avoid high fluctuations based on the deposition speeds on the monocrystalline portions and on the non-monocrystalline portions.

The invention thus offers a simple and reliable solution to epitaxially deposit a semi-conductive layer only on monocrystalline patterns.

According to a non-limiting example, the conditions of the first and second depositions, in particular the first content and the second content, as well as the conditions of the etching being regulated such that;
Vg220>k.Vg120, Vg120 and Vg220 being respectively the etching speeds of the first sacrificial layer portion and of the second sacrificial layer portion, k being greater than or equal to 2,
the thickness $e_{120}$ of the first sacrificial layer portion formed by the second deposition is sufficient such that, after said etching, at least one portion of the thickness $e_{110}$ of the first growth layer portion deposited on the first pattern subsists. Thus, according to this example, coming from the etching step of each cycle, the thickness $e_{120}$ of the first sacrificial layer portion is fully removed. This allows to increase the etching time to etch the second growth layer portion, while allowing to fully conserve the first growth layer portion, or remove a very low thickness of it. This thus allows to resolve the problem consisting of making a crystalline layer grow quickly selectively to the non-crystalline zones. Preferably, e>0 and $e_{110}$>$e_{210}$.

According to another aspect, the present invention is based on a method for forming a layer by cycled epitaxy comprising at least the following steps:

providing a wafer comprising at least one first monocrystalline pattern and at least one second pattern taken from among an amorphous pattern or a polycrystalline pattern, carrying out at least one sequence of steps, each comprising at least the following successive steps:

first deposition, preferably by epitaxy, so as to form:
a first growth layer portion formed by epitaxy on the first pattern and having a thickness $e_{110}$ and
a second growth layer portion formed on the second pattern and having a thickness $e_{210}$
at least because of the different in crystalline structure between the first and second patterns, coming from the first deposition, the thicknesses $e_{210}$ and $e_{110}$ are such that $e_{210}$>$e_{110}$.

The first deposition is carried out from a first chemistry comprising a first semi-conductor and an additional species, the first content t1 of additional species in the first chemistry being selected such that the first portion and the second portion of the growth layer have a concentration c1 of additional species.

second deposition, preferably by epitaxy, so as to form:
a first sacrificial layer portion formed by epitaxy on the first growth layer portion and having a thickness e120 and
a second sacrificial layer portion formed on the second growth layer portion and having a thickness e210.

The second deposition is carried out from a second chemistry comprising a second semi-conductive species and having a second content t2 of said additional species, the second content t2 of additional species being selected such that the first portion and the second portion of the sacrificial layer have a concentration c2 of additional species, such that 0 c2<c1.

BRIEF DESCRIPTION OF THE FIGURES

The aims, objectives, as well as the features and advantages of the invention will emerge better from the detailed description of embodiments of the latter which are illustrated by the following supporting drawings, wherein.

Figure 1A:
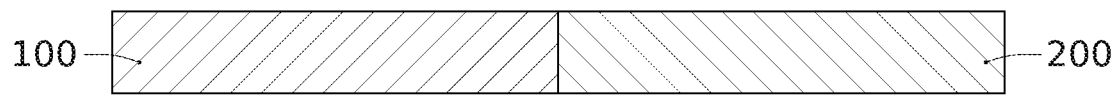
FIG. 1A schematically illustrates an example of a structure which could serve as a starting base for carrying out the method according to the invention.

The drawings are given as examples and are not limiting of the invention. They constitute principle schematic representations intended to facilitate the understanding of the invention and are not necessarily to the scale of the practical applications. In particular, the relative thicknesses of the different growth layers and of the sacrificial layers are not representative of reality.

DETAILED DESCRIPTION

Before starting a detailed review of embodiments of the invention, optional features are stated below, which can possibly be used in association or alternatively:

According to an embodiment, the first pattern and the second pattern are made in identical materials. Thus, the chemical nature of the material deposited during the first deposition and that of the material deposited during the second deposition, different only through the contents in said additional species. Alternatively, the first pattern and the second pattern are made of different materials.

According to an example, the first pattern is made of a material with the basis of an element of the column IV of the periodic table, preferably the first pattern is made of Si, SixGey, SixGeySnz, SixCy or Ge (x and y being non-zero integers).

According to an example, the second pattern is made of a material with the basis of an element of the column IV of the periodic table, preferably the first pattern is made of Si, SixGey, SixGeySnz, SixCy or Ge (x and y being non-zero integers).

According to an example, the second pattern is made of a dielectric material. According to an example, the second pattern is an oxide or a nitride. It can, for example, be a silicon oxide $Si_3O_y$ or a silicon nitride $Si_xN_y$, x and y being integers.

The first and second patterns have identical or different sizes, the size of a pattern being preferably the surface of this pattern exposed to an epitaxial growth. This is therefore the surface of the pattern from which the epitaxial growth can be performed.

According to an example, said first semi-conductive species and said second semi-conductive species are identical.

Alternatively, said first semi-conductive species and said second semi-conductive species are different.

According to an example, the first semi-conductive species is silicon-based. According to an example, the first growth layer portion and the second growth layer portion are silicon-based layers. They are made of Si or SiGe, added from the additional element.

Alternatively, the first growth layer portion and the second growth layer portion are Ge layers added from the additional element.

Alternatively, the first growth layer portion and the second growth layer portion are SiGeSn layers added from the additional element.

According to an example, the first growth layer portion and the second growth layer portion are layers with the basis of one from among silicon and germanium, the first sacrificial layer portion and the second sacrificial layer portion being also layers with the basis of one from among silicon and germanium.

The nature of the precursor including the semi-conductive species and the flow of this precursor are selected such that the concentration of the additional species within the layer deposited during the first deposition step is greater than or equal to $5.E19$ at/$cm^3$.

According to an example, the additional species is a doping agent, i.e. any species capable of changing the electric conduction properties of the layer formed by epitaxy. According to an example, the additional species is taken from among phosphorus, boron, arsenic or antimony.

Alternatively, the additional species is carbon (C).

According to an example, the second content t2 is zero. This means that the deposition chemistry does not comprise any additional species. If the deposition is carried out using a reactor, the injection flow of the additional species in this reactor is zero. It ensues that the concentration c of additional species in the layer deposited is also zero.

According to an example, the first sacrificial layer portion and the second sacrificial layer portion are fully removed from the etching step of each cycle. Thus, during each cycle, the thicknesses $e_{120}$ and $e_{220}$ are fully etched. This allows to make the first and second sacrificial layer portions play their role of sacrificial layers. The etching of the second growth layer portion is thus significant while the etching of the first growth layer portion can be zero or low.

According to an example, the second semi-conductive species is silicon-based. According to an example, the first sacrificial layer portion and the second sacrificial layer portion are silicon-based layers. They are made of Si or SiGe, possibly added from an additional element.

Alternatively, the first sacrificial layer portion and the second sacrificial layer portion are Ge layers, added from the additional element.

According to an embodiment, the additional species of the first deposition is identical to the additional species of the second deposition.

According to an embodiment, the first growth layer portion and the second growth layer portion are made of phosphorus-doped silicon (Si:P) and the first sacrificial layer portion and the second sacrificial layer portion is made of silicon (Si).

According to another embodiment, the first growth layer portion and the second growth layer portion are made of boron-doped silicon-germanium (SiGe:B) and the first sacrificial layer portion and the second sacrificial layer portion are made of silicon-germanium (SiGe).

According to an example, at each cycle, the etching etches the whole thickness $e_{210}$ and the whole thickness $e_{220}$, and conserves the whole thickness $e_{110}$ of the first growth layer portion deposited on the first pattern. Thus, coming from each cycle, it subsists the whole thickness $e_{110}$ of the first growth layer portion.

According to an example, the conditions of the etching, in particular $V_{g120}$, $V_{g220}$ $V_{g220}$ and the thicknesses $e_{120}$ and $e_{110}$ are adjusted such that, after etching the whole thickness $e_{210}$ and the whole thickness $e_{220}$, it subsists the whole thickness $e_{110}$ of the first growth layer portion deposited on the first pattern. According to an example, the thickness $e_{110}$ of the first growth layer portion and the thickness $e_{210}$ of the second growth layer portion 210 are comprised between 2 nm and 100 nm, and preferably between 2 nm and 50 nm.

According to an example, the thicknesses $e_{120}$ of the first sacrificial layer portion and $e_{220}$ of the second sacrificial layer portion are comprised between 2 nm and 50 nm and preferably between 2 nm and 20 nm.

According to an example, after the first deposition and after the second deposition, during said etching, also the whole thickness $e_{210}$ of the second growth layer portion is etched.

According to an example, the method comprises, after having carried out at least one sequence of steps, a final etching step configured to remove a possible residue of the second growth layer portion.

According to an example, this final etching step is based on a chlorine (Cl)-based chemistry.

According to an example, said sequence of steps is carried out at least twice and preferably at least three times.

According to an example, the first and second growth layers are directly in contact with the first and second sacrificial layer portions, respectively.

By a material A-"based" substrate, film, layer, this means a substrate, a film, a layer comprising this material A only or this material A and possibly other materials, for example an additional species such as a doping agent.

In the present invention, a species capable of modifying the electric conduction properties of the material wherein this species is implanted, is qualified as doping species or doping agent.

The word "dielectric" qualifies a material of which the electric conductivity is sufficiently low in the application given to serve as an insulator.

It is specified that, in the scope of the present invention, the terms "on", "surmounts", "covers", "underlying", "opposite" and the equivalents thereof do not necessarily mean "in contact with". Thus, for example, the deposition, the removal, the gluing, the assembly or the application of a first layer on a second layer, does not compulsorily mean that the two layers are directly in contact with one another, but means that the first layer covers at least partially the second layer by being either directly in contact with it, or by being separated from it by at least one other layer or at least one other element.

A layer can moreover be composed of several sublayers of one same material or of different materials.

By "nature", this means a material, the chemical composition thereof and/or the crystalline structure thereof. Thus, two layers can be of the same chemical composition, but of a different nature from a crystallographic standpoint.

In the present invention, a doping means that the doping species is present in the layer deposited with a concentration greater than or equal to 1 atom of doping species for less than 1000 atoms of the semi-conductor and preferably for less than 10 to 100 atoms of the material forming the semi-conductive layer.

In the present invention, doping agent types will be indicated. These doping agents are non-limiting examples. The invention covers all types of embodiments, wherein the doping agents are inversed. Thus, if an example of an embodiment mentions, for the first zone, a doping agent P and for a second zone, a doping agent N, the present description thus implicitly describes at least the inverse example wherein the first zone has a doping agent N and the second zone, a doping agent P.

Another aim of the present invention relates to a microelectronic device comprising a plurality of transistors according to the invention. By microelectronic device, this means any type of device produced with microelectronic means. These devices comprise in particular in addition to the devices with a purely electronic purpose, micromechanical or electromechanical devices (MEMS, NEMS, etc.), as well as optical or optoelectronic devices (MOEMS, etc.).

It is specified that in the scope of the present invention, the thickness of a layer is measured along a direction perpendicular to the surface according to which this layer or a substrate on which this layer rests has the maximum extension thereof.

If the layer is deposited on a wafer, thus the thickness thereof is taken perpendicularly to the parallel faces of this wafer.

In the figures, the thickness is taken along the vertical. Likewise, when it is indicated that an element is situated to the right of another element, this means that these two elements are both situated on one same line perpendicular to the main plane of the substrate, that is on one same line oriented vertically in the figures.

It will be noted that in the present invention, contents of a species are qualified as the content of this species in the chemistry serving as the deposition of a layer, the chemistry being, for example, that formed in an epitaxial deposition reactor. This content can thus, for example, be a function of the ratio of the flow of the gas comprising this species on the flow of all of the gases injected in the reactor.

It will be noted that in the present invention, concentration of a species is qualified as the content of this species in the layer deposited where the material deposited comprising this species.

A concentration will be, for example, measured in atoms per cubic centimetre (at/cm$^3$), by using for example, SIMS (Secondary Ion Mass Spectrometry) technology.

A non-limiting example of the method according to the invention will now be described in reference to FIGS. 1A to 8.

As illustrated in FIG. 1A, a first step consists of providing a structure having at least one first pattern 100, monocrystalline, and at least one second pattern 200, which is not monocrystalline.

These patterns 100, 200 are, for example, formed on a wafer, such as a wafer usually used in the microelectronics industry. These patterns 100, 200 can be adjacent, as illustrated in FIG. 1A to facilitate the understanding of the invention, or separate from one another. In the latter case, they can be coplanar and can have the same thickness. Thus, the lower faces thereof can be contained in one same plane and the upper faces thereof can also be contained in one same plane. Alternatively, either of the lower and upper faces of the patterns 100, 200 can belong to different planes. For an application to a three-dimensional structure, the latter alternative is preferred.

As a non-limiting example, the patterns 100 and 200 can have a thickness comprised between 1 nm and 500 nm.

Preferably, the pattern 100 is formed in a semi-conductive material, for example silicon (Si)-based, germanium (Ge)-based or silicon-germanium (SiGe)-based.

According to an example, the pattern 200 is made of a dielectric material, such as an oxide or a nitride. Preferably, the pattern 200 is also formed on the basis of a semi-conductive material such as silicon, germanium (Ge) or silicon-germanium (SiGe). Thus, if this pattern 200 is an oxide or a nitride, this is a silicon oxide $Si_xO_y$ or a silicon nitride $Si_xN_y$, x and y being integers.

According to an example of an embodiment, the patterns 100, 200 are formed from one same material. Such is, for example, the case, if these patterns 100, 200 are formed from one same silicon layer, since portions of this layer intended to define the second patterns 200 form the subject of an oxidation or nitridation step. It can also be provided that these patterns 100, 200 are formed of one same material having a different crystalline state.

Figure 1B:
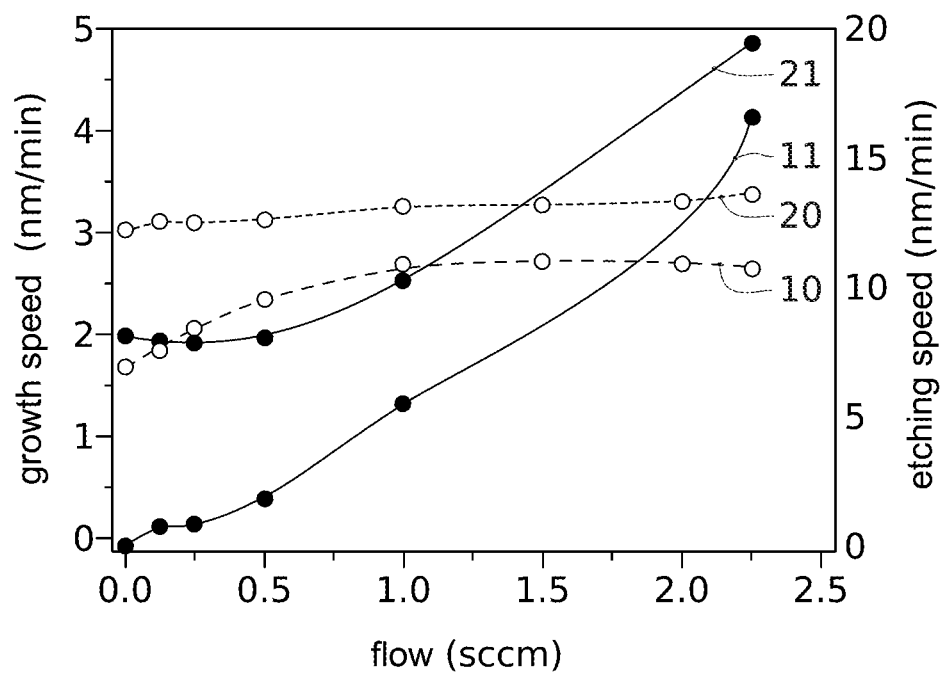
FIG. 1B is a graph illustrating, according to the flow of an additional species, such as a doping agent, the epitaxial deposition growth speed (ordinate scale on the left), as well as the etching speed (ordinate scale on the right), for layers surmounting respectively a monocrystalline pattern and an amorphous pattern.

In the example illustrated through the graph of FIG. 1B, the pattern 100 is made of monocrystalline silicon and the pattern 200 is made of amorphous silicon. All the features and the advantages which will be mentioned below in reference to these patterns are also applicable to patterns having another nature, typically to patterns 100, 200 which are not made of silicon and to patterns 200 which are not amorphous, but polycrystalline.

FIG. 1B represents, a growth speed (curves 10, 20) or an etching speed (curves 11, 21) according to the flow of an additional species injected in the equipment used, to carry out depositions or an etching. More specifically:

the curve 10 illustrates the growth speed by epitaxy of a silicon-based layer on a monocrystalline pattern 100.

the curve 20 illustrates the growth speed of a silicon-based layer surmounting a non-monocrystalline pattern, here an amorphous pattern 200.

The growth speeds are read on the ordinate axis situated to the left of the graph. These speeds are expressed in nanometres ($10^{-9}$m) per minute.

The curve 11 illustrates the etching speed of a monocrystalline layer deposited on the monocrystalline pattern 100, by being directly or not in contact with this pattern 100.

The curve 21 illustrates the etching speed of a non-monocrystalline layer deposited on the amorphous pattern 200, by being directly or not in contact with this pattern 200.

The etching speeds are read on the ordinate axis situated to the right of the graph. These growth and etching speeds are expressed in nanometres ($10^{-9}$m) per minute. The thicknesses are measured along a direction perpendicular to the main surface plane according to which the patterns 100, 200 extend. In the figures, the thickness is measured along a vertical direction.

The analysis of the curves 10 and 20 shows that the growth speed on the monocrystalline patterns 100 is always lower than on the amorphous patterns 200. The growth speed ratio $V_{c210}/V_{c110}$ (with $V_{c210}$=growth speed $V_{c210}$ on the amorphous patterns 200 and $V_{c110}$=growth speed $V_{c110}$ on the monocrystalline patterns 100) is relatively high in the case where the additional species is absent or present in a low quantity. Indeed, this ratio $V_{c210}/V_{c110}$ is about equal to 2 in the absence of any additional species. This ratio is reduced when an additional species is added, then tends to be stabilised. For a $PH_3$ flow of 1 sccm, taken as an additional species, at a temperature of 500° C., the deposition speed on monocrystalline patterns 100 is about 2.5 nanometres per minute (nm/min), while this speed is about 3.2 nm/min on amorphous patterns 200. Thus, this ratio $V_{c210}/V_{c110}$ is no more than 1.28.

The analysis of the curves 11 and 21 shows that the etching speed $V_{g1}$ on the monocrystalline patterns 100 is a lot less than the etching speed $V_{g2}$ on the amorphous patterns 200 in the case where the additional species is absent or present in a low quantity in the chemistry used to carry out the epitaxial deposition (typically less than 0.1 sccm in this case).

It appears in the example of this graph of FIG. 1B that for an additional species $PH_3$ introduced with a flow of 0.025 sccm, $V_g \approx 0.85$ nm/min and $V_{g2} \approx 8.2$ nm/min. The ratio $R=V_{g2}/V_{g1}$ is thus about 9.6, which means that the layer deposited on the amorphous patterns 200 is etched 9.6 times quicker than the layer deposited on the monocrystalline patterns 100.

However, the etching speed $V_{g1}$ on the monocrystalline patterns 100 gets closer to the etching speed $V_{g2}$ on the amorphous patterns 200 in the case where the additional species is present in a greater quantity.

Thus, it appears on this graph of FIG. 1B, that with a $PH_3$ flow of 2.25 sccm, $V_g$, 17 nm/min and $V_{g2} \approx 20$ nm/min. The ratio $V_{g2}/V_g$, is thus about 1.18, which is a lot less (more than 8 times less) than the ratio $V_{g2}/V_{g1}$ obtained for a $PH_3$ flow of 0.025 sccm.

When the additional species is injected with a flow of 0.5 sccm, this ratio R of the etching speeds is about equal to 4.4.

As will be indicated in detail below, the invention benefits from these fluctuations in growth speed and of the ratio R of etching speeds according, on the one hand, to the concentration of additional species in the chemistry serving at the deposition (and therefore of the content of additional species within the layers deposited) and on the other hand, according to the crystalline nature of the pattern from which the layers are epitaxially deposited.

To this end, the invention provides, after a first deposition of a semi-conductive layer having a concentration c1 of additional species, to carry out a second deposition of a semi-conductive layer having a concentration c2 of zero or strictly less than c1. This second deposition acts as a stop layer to stop the etching before consuming the first deposition carried out on the monocrystalline patterns 100, this just as this second deposition does not prevent the etching being carried out on the amorphous or polycrystalline patterns 200.

Figure 2A:
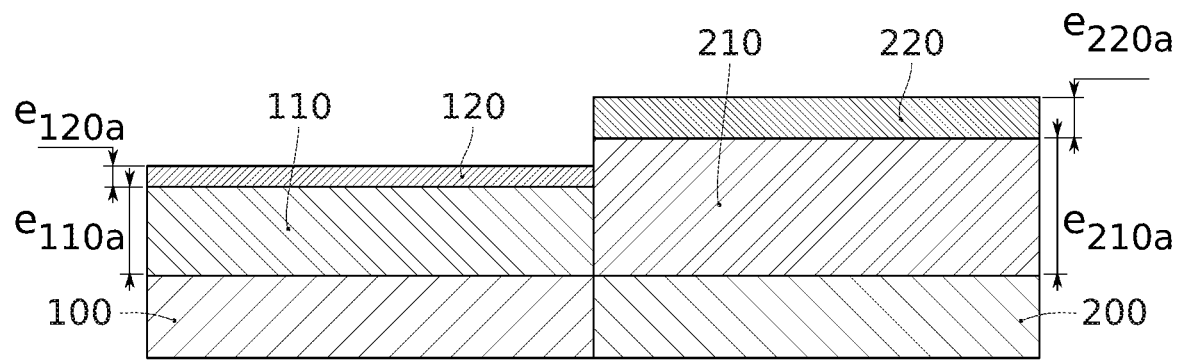
FIG. 2A schematically illustrates the structure of FIG. 1A after deposition of a growth layer and deposition of a sacrificial layer on a crystalline pattern and a non-monocrystalline pattern.
Figure 4A:
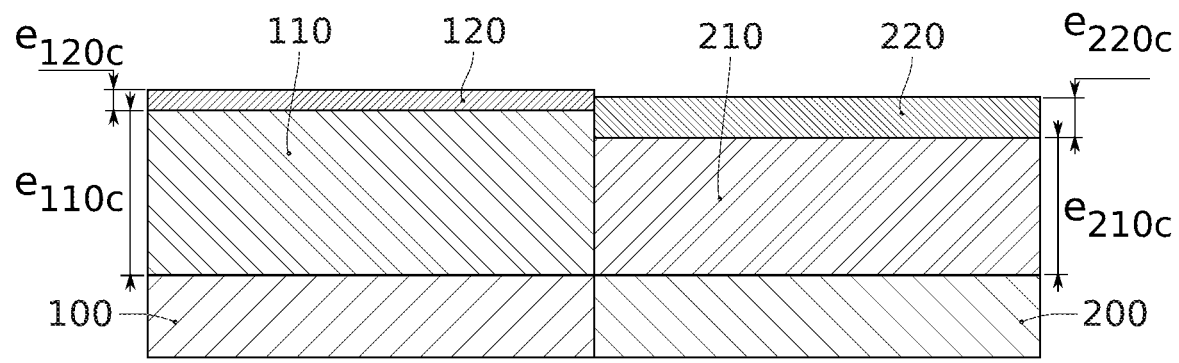
FIG. 4A schematically illustrates the structure of FIG. 3A after additional deposition steps corresponding to the depositions illustrated in FIG. 2B.
Figure 6A:
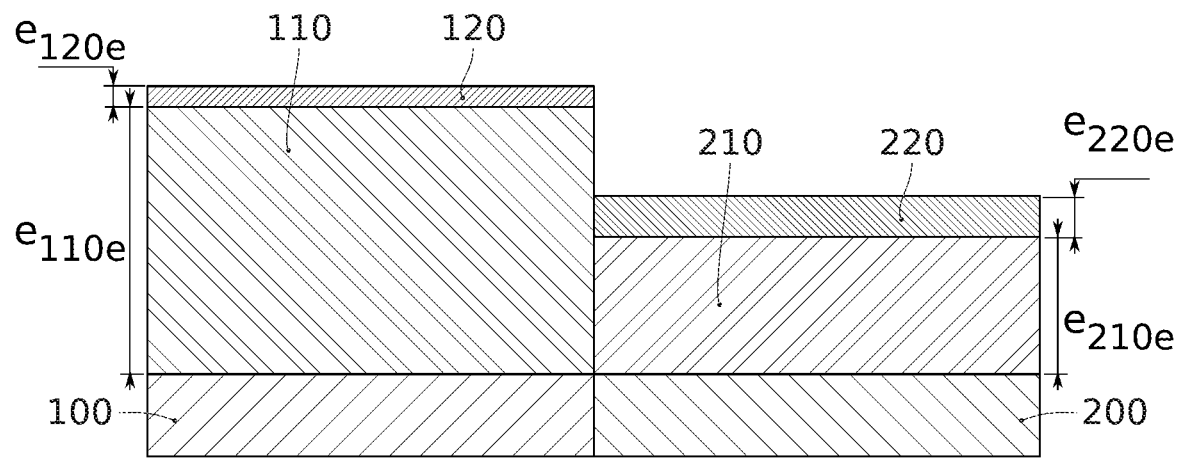
FIG. 6A schematically illustrates the structure of FIG. 5A after additional deposition steps corresponding to the depositions illustrated in FIG. 2B.

The additional species is, for example, a doping species. More specifically, from the step illustrated in FIG. 1A, a sequence is carried out, and preferably at least two, even more sequences, each comprising the following steps:

a first deposition, as illustrated in FIGS. 2A, 4A, 6A, in the presence of a content t1 of additional species in the deposition chemistry, so as to form:
  a first growth layer portion 110, epitaxial, of thickness $e_{110}$, on the monocrystalline pattern 100. The first growth layer portion 110 has a concentration c1 of additional species;
  a second growth layer portion 210, of thickness $e_{210}$, on the non-monocrystalline pattern 200. The second growth layer portion 210 has a concentration c1 of additional species.

Figure 3A:
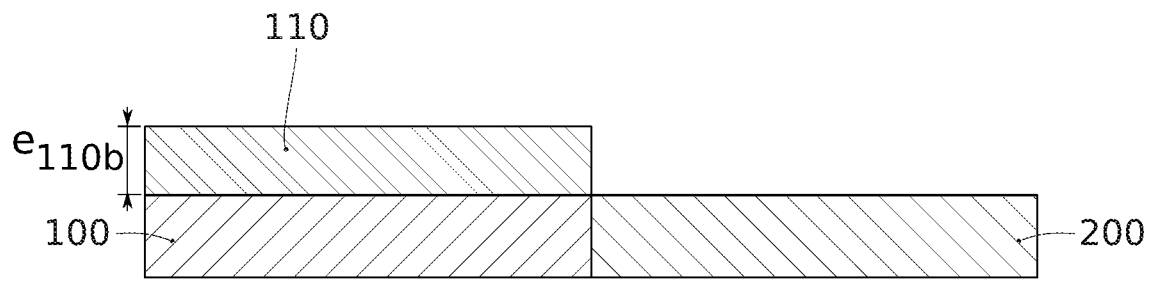
FIG. 3A schematically illustrates the structure of FIG. 2A after an etching step, leaving in place at least one portion of the growth layer on the monocrystalline pattern and leading to the removal of the growth layer, as well as the sacrificial layer surmounting the non-monocrystalline pattern.
Figure 5A:
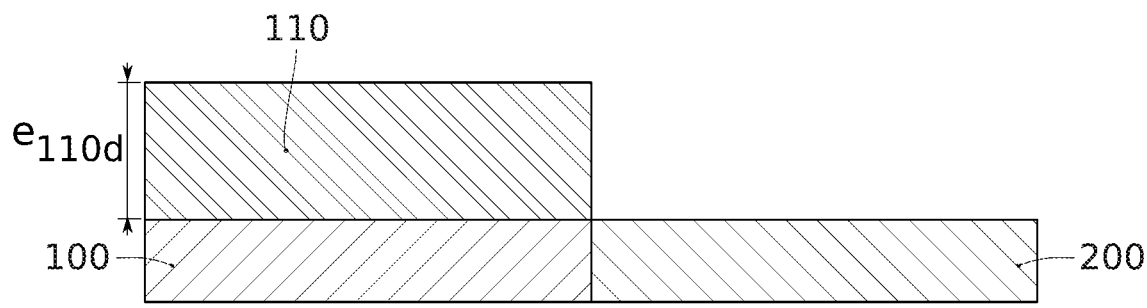
FIG. 5A schematically illustrates the structure of FIG. 4A after an etching step, leaving in place at least one portion of the growth layer on the monocrystalline pattern and leading to the removal of the growth layer, as well as the sacrificial layer surmounting the non-monocrystalline pattern.
Figure 7A:
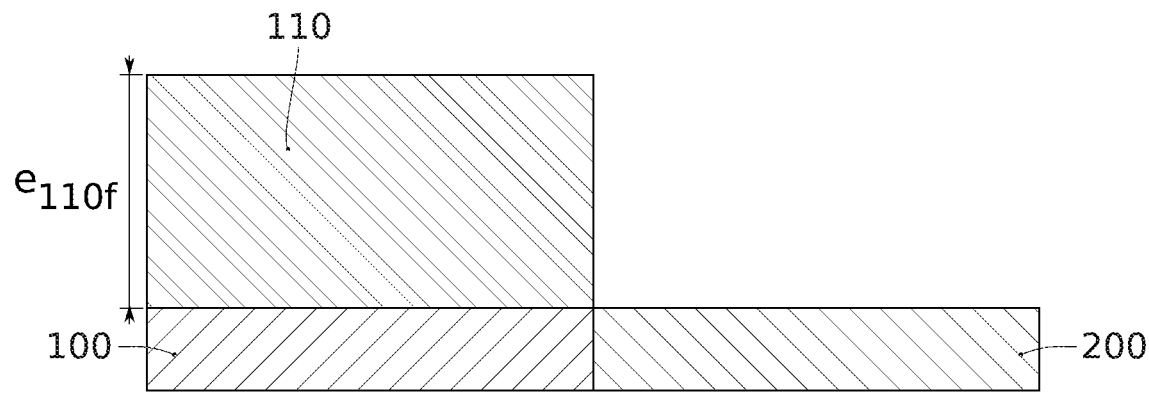
FIG. 7A schematically illustrates the structure of FIG. 6A after an etching step, leaving in place at least one portion of the growth layer on the monocrystalline pattern and leading to the removal of the growth layer, as well as the sacrificial layer surmounting the non-crystalline pattern.

During this step, the nature of the precursor including the semi-conductive species, as well as the flow of this precursor and the flow of the precursor including the additional species are selected such that the concentration c1 of the additional species within the deposited layer is greater than or equal to $5.10^{19}$ atoms per cubic centimetre.

a second deposition, as illustrated in FIGS. 2A, 4A, 6A, with a content t2 of said additional species in the deposition chemistry, such that t2<t1 so as to form:
  a first sacrificial layer portion 120, of thickness $e_{120}$, on the first growth layer portion 110;
  a second sacrificial layer portion 220, of thickness $e_{220}$, on the second growth layer portion 210;
an etching, as illustrated in FIGS. 3A, 5A, 7A:
  of the second sacrificial layer portion 220 over the whole of the thickness $e_{220}$ thereof,
  of the second growth layer portion 210 over the whole of the thickness $e_{210}$ thereof,
  of at least one portion of the first sacrificial layer portion 120,
  with stopping before consumption of the whole thickness $e_{110}$ of the first growth layer portion 110.

Figure 8:
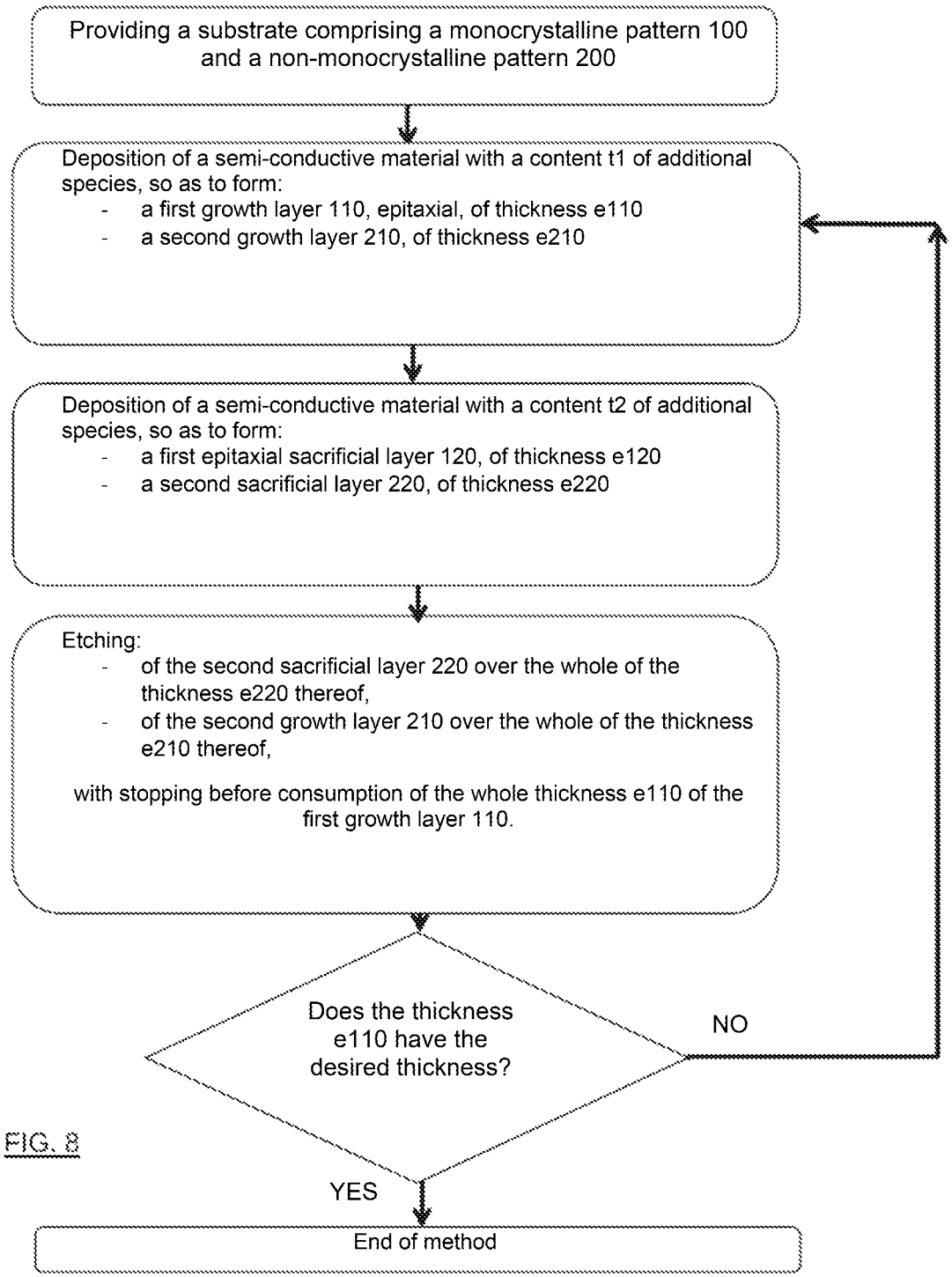
FIG. 8 illustrates, in the form of a flowchart, the main steps of a method according to the present invention.

As illustrated in FIG. 8, this sequence of steps is repeated until the first growth layer portion 110 surmounting the monocrystalline pattern 100 has the final desired thickness $e_{110}$.

These steps will be described in detail below in reference to FIGS. 2A to 7B. A first sequence of steps is described in reference to FIGS. 2A and 3B.

FIG. 2A illustrates the result obtained after two successive epitaxial depositions.

The first deposition leads to the formation of the first growth layer portion 110 on the monocrystalline pattern 100 and to the formation of the second growth layer portion 210 on the pattern 200 which is not monocrystalline.

In this example, the growth layers 110 and 210 are directly in contact with the patterns 100 and 200. Alternatively, at least one intermediate layer can be provided between the growth layers 110, 210 and respectively the patterns 100, 200. In this case, the intermediate layer(s) must reproduce the type of crystalline type of the patterns 100, 200. Thus, the intermediate layer underlying the first growth layer portion 110 must be monocrystalline and the intermediate layer underlying the second growth layer portion 210 must not be monocrystalline.

In this example, the growth layers 110 and 210 are obtained by a phosphorus-doped silicon (Si:P) deposition.

The semi-conductive species is therefore silicon. It is, for example, introduced in the deposition chemistry, for example, by using a $Si_nH_{2+2n}$ type silicon precursor, n being an integer.

The additional species, phosphorus (P), is introduced in the deposition chemistry, for example, by using the precursor $PH_3$. This precursor is introduced in the reactor with a flow of 0.5 sccm, according to this example.

The layers 110, 210 deposited have concentrations of additional species, here phosphorus, which depend on the content of this additional species in the chemical composition serving as a deposition. This content itself depends on the ratio of the precursor flow comprising the additional species over the total flow injected in the deposition reactor. It can be considered that for a given content of additional species in the deposition chemistry, the concentrations of this additional species in the layers 110 and 210 are identical.

Due to the crystallographic structural difference, the growth speed $V_{c210}$ is greater on the non-monocrystalline pattern 200 than the growth speed $V_{c110}$ on the monocrystalline pattern 100.

Thus, at the end of the deposition, the thickness $e_{210}$ of the layer 210 is greater than the thickness $e_{110}$ of the layer 110.

Figure 2B:
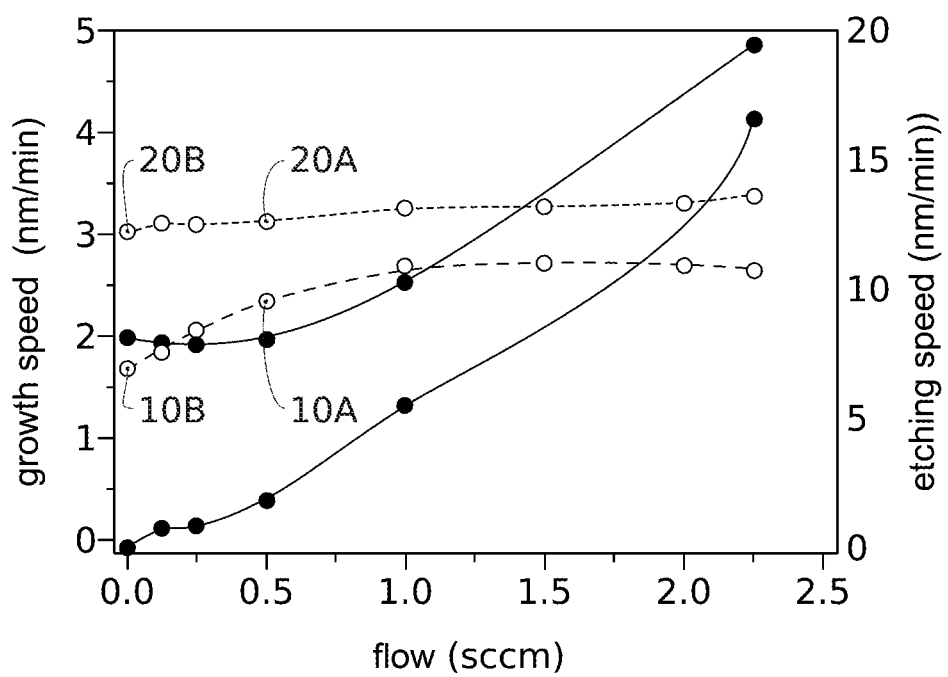
FIG. 2B returns to the graph of FIG. 2A, by mentioning the values retained for the flows of additional species, on the one hand, for the first deposition and, on the other hand, for the second deposition illustrated in FIG. 2A.

Indeed, it emerges from FIG. 2B, that with a $PH_3$ flow of 0.5 sccm, the growth speed of Si:P on the pattern 200 is about 3.1 nm/min while the growth speed of Si:P on the pattern 100 is only about 2.3 nm/min. These speeds $V_{c110}$, $V_{c210}$ are referenced 10A and 20A in FIG. 2B.

Typically, during this first epitaxial deposition, the thicknesses $e_{110}$ and $e_{210}$ deposited can be comprised between 2 nm and 100 nm preferably between 2 nm and 50 nm nanometres according to the growth duration applied.

Following this first deposition, a second deposition is carried out by epitaxy. The content t2 of the additional species in the chemistry of this second deposition is adjusted such that the layers deposited 120, 220 have a concentration c2 of said additional species strictly less than c1. The concentration c2 is, according to a particular example of an embodiment, zero.

This second deposition leads to the formation of the first sacrificial layer portion 120 on the monocrystalline pattern 100 and to the formation of the second sacrificial layer portion 220 on the pattern 200 which is not monocrystalline.

This second deposition can be carried out:
  directly in contact with the growth layer portions 110, 210 as is illustrated in FIG. 2A, or
  in contact with one or more intermediate layers disposed between the growth layer portions 110, 210 and the sacrificial layer portions 210, 220.

In the example illustrated, the sacrificial layer portions 120, 220 are obtained by a non-doped silicon deposition, i.e. with a zero concentration c2. Thus, during this flow of additional species is zero.

During this step, due to the crystallographic structural difference, the growth speed is greater on the pattern 200 than on the pattern 100.

Thus, the thickness $e_{220}$ of the layer 220 is greater than the thickness $e_{120}$ of the layer 120.

Indeed, it emerges from FIG. 2B, that with a $PH_3$ flow of 0 sccm, the growth speed $V_{c220}$ of Si on the non-monocrystalline pattern 200 is about 3 nm/min, while the growth speed $V_{c120}$ of Si on the monocrystalline pattern 100 is only about 1.7 nm/min. These growth speeds $V_{c120}$, $V_{c220}$ are referenced 10B and 20B in FIG. 2B.

Typically, during this second epitaxial deposition, the thicknesses $e_{110}$ and $e_{210}$ deposited can be comprised between 2 nm and 20 nm preferably between 2 nm and 15 nm nanometres.

For this first sequence, the thicknesses of the layers 110, 210, 120, 220 are referenced $e_{110a}$, $e_{210a}$, $e_{120a}$ and $e_{220a}$ in FIG. 2A, by comparison to the thicknesses which will be deposited or etched during the following steps and sequences.

FIG. 3A illustrates an etching step configured to fully etch the thickness $e_{220}$ of the second sacrificial layer portion and fully the thickness $e_{210}$ of the second growth layer portion surmounting the pattern 200 which is not monocrystalline.

According to an alternative embodiment, it will be noted that it is possible to leave a portion of the thickness $e_{210}$ coming from each sequence to subsist, on the condition that at the end of each sequence, the thickness $e_{110}$ is greater than the thickness $e_{210}$. This residual portion of the initial thickness $e_{210}$ can, for example, be removed at the end of the method. The etching of this residual thickness can be carried out during a final etching or during the etching of the last sequence each comprising deposition and etching.

This embodiment has the technical effect of reducing the exposure of the material 200 in the etching step. It therefore allows to resolve the problem consisting of reducing the damage of this layer 200.

However, this etching step is configured to leave all or some of the thickness $e_{110}$ of the first portion 110 of the growth layer surmounting the monocrystalline pattern 100 to subsist.

Figure 3B:
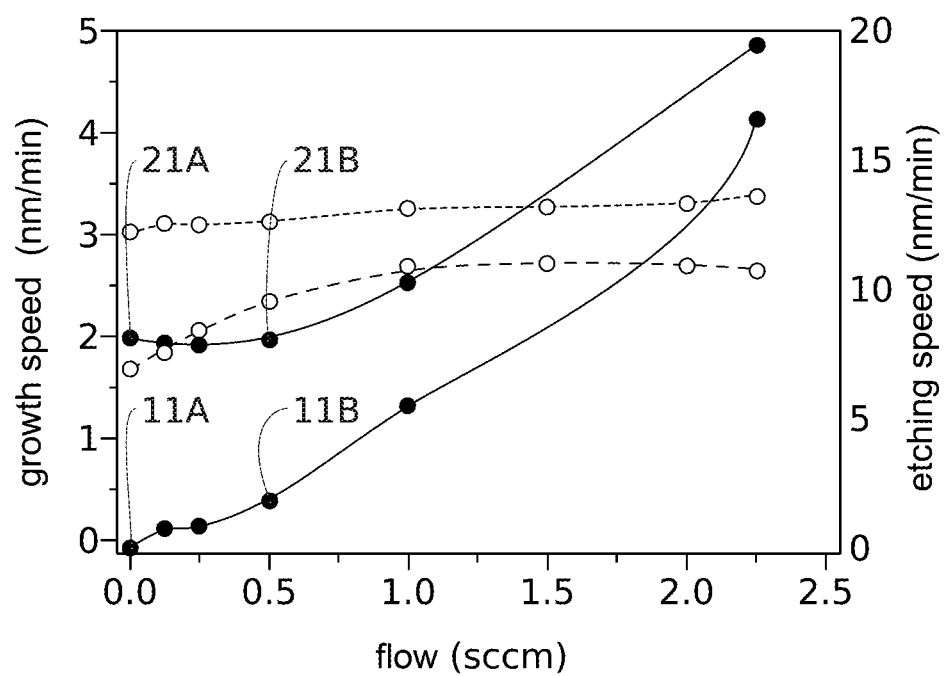
FIG. 3B returns to the graph of FIG. 2A, by mentioning the values applicable to the etching speeds for the etching step illustrated in FIG. 3A.

Regarding references 11A, 21A of FIG. 3B, it is indeed perfectly possible to precisely control the complete removal of the layers 210, 220 deposited on the pattern 200 while conserving all or some of the layer 110 deposited on the pattern 100.

For this, the conditions of the first and of the second depositions must be selected, in particular the first content t1 and the second content t2 of additional species such that $V_{g220} > k \cdot V_{g120}$, $V_{g120}$ and $V_{g220}$ being respectively the etching speeds of the first sacrificial layer portion 120 and of the second sacrificial layer portion 220. Preferably, k is greater than or equal to 2, preferably greater than 3 or 4.

The contents t1 and t2 of additional species and growth speeds $V_{c110}$, $V_{c210}$, $V_{c120}$, $V_{c220}$ of the layers 110, 210, 120, 220 must also be selected, as well as the duration of each of these deposition steps, such that the thicknesses deposited $e_{110a}$, $e_{210a}$, $e_{120a}$, $_{20a}$, $e_{220a}$ are sufficient such that at least one portion of the thickness $e_{110}$ of the first growth layer portion 110 subsists, when the whole thickness $e_{210a}$ and the whole thickness $e_{220a}$ are consumed by etching. The residual portion is referenced $e_{110b}$ in FIG. 3A.

Particularly advantageously, with the method claimed, the ratios of the etching speeds $V_{g220}/V_{g120}$ and $V_{g210}/V_{g110}$ are greater than the ratio of the growth speeds $V_{c220}/V_{c120}$. Subsequently, the longer the second deposition step lasts, i.e. the more the thickness $e_{120}$ increases, the easier it will be to fully remove the layers 210 and 220 by leaving in place a significant thickness $e_{110b}$ of the first growth layer portion 110.

It will be noted that the invention enables an increase of the content by doping with respect to the values of the examples mentioned above. For example, if during the first deposition, it is selected to greatly increase the $PH_3$ flow (1.5 sccm or more), it will remain perfectly possible to implement the principle of the invention.

It will also be noted that it is possible that with other types of additional elements, typically of other doping agents, the etching speeds $V_{g110}$ and $V_{g210}$ can be identical to one another in the presence of doping agents (thus, the curves 11 and 21 could be superposed from a given threshold of doping agents). Due to the fact that $V_{g220}$ is a lot greater than $V_{g120}$ for a zero or low concentration of doping agent, thus it will remain perfectly possible to fully etch the layers deposited on the non-monocrystalline patterns 200 while conserving a layer on the monocrystalline patterns 100.

According to the deposition and etching conditions (in particular according to the thickness $e_{120a}$), $e_{110a} \approx e_{110b}$ can be had. This means that when the whole thickness $e_{220a}$ and the whole thickness $e_{210a}$ are removed, the etching has not started to consume the first growth layer portion 110. In practice, there can be a consumption of a portion of the first growth layer portion 110. In this case, and as is illustrated in FIG. 3A, $e_{110a} > e_{110b}$.

The stopping of this etching is carried out over time. The whole thickness $e_{210}$ of the second growth layer portion 210 will be removed. Preferably, the pattern 200 which is not monocrystalline, is not consumed. Also, a minimum of the thickness $e_{110}$ of the first growth layer portion 110 is also consumed.

It will be noted that it is possible that the sacrificial layers 120, 220 include a concentration c2 of the additional species which is not zero. This can result from an inevitable incorporation of species in the sacrificial layers 120, 220, even of a migration of these species from the underlying layers. This presence of additional species in the sacrificial layers 120, 220 can also be voluntary. Indeed, the method of the present invention benefits from the variation of the ratio $R = V_{g2}/V_{g1}$ ($V_{g2}$ being the etching speed of the layers deposited on the non-monocrystalline portions and $V_{g1}$ being the etching speed of the layers deposited on the monocrystalline portions) according to the concentrations c1 and c2 of additional species within the layers deposited. It is thus perfectly possible to consider that the sacrificial layers 120, 220 have a concentration c2 of non-zero additional species from the time when this concentration c2 leads to a sufficiently high ratio $R^2 = V_{g220}/V_{g120}$, for example greater than 2, to allow to consume all or some of the thickness $e_{210}$ before the whole thickness $e_{120}$ is consumed. For example, and without this being limiting, this etching can be carried out by using a $Cl_2$ under $N_2$-based chemistry.

As indicated above during this etching step, at least some of the thickness $e_{120}$ of the first sacrificial layer portion is etched. Consequently, coming from this etching step, it is advantageous to provide that:

the whole thickness $e_{120}$ of the first sacrificial layer portion 120 is etched, and the whole thickness $e_{110}$ of the first growth layer portion 110 is conserved, or at the very least, some of the thickness $e_{110}$ of the first growth layer portion 110 is conserved.

According to an alternative embodiment, it can be provided that coming from the etching step, only some of the thickness $e_{120}$ of the first sacrificial layer portion 120 is etched.

The method according to the invention can be interrupted at the end of this etching step. The thickness of the semi-conductive layer 110 obtained is therefore $e_{110b}$.

On the contrary, if it is needed to obtain a greater thickness for this semi-conductive layer 110, this sequence of steps can thus be repeated one or more times.

Thus, the FIGS. 4A to 5B illustrate a second sequence of steps and FIGS. 6A to 7B illustrate a third sequence of steps.

Thus, and as illustrated in FIG. 4A, a first step of depositing the material is carried out during a second sequence in the presence of the additional element, phosphorus in this non-limiting example.

During this first deposition, the content of the additional element is a function of the flow of this element, or more specifically, the precursor (here, $PH_3$) of this additional element, in the deposition reactor. As illustrated in the non-limiting example of FIG. 4B, this flow is 0.5 sccm (see references 10C and 20C).

Coming from this deposition, the first growth layer portion 110 situated on the monocrystalline pattern 100 has a thickness $e_{110c}$. This thickness $e_{110c}$ is equal to the sum of the thickness $e_{110b}$ of the residual layer obtained from step 3A and from the thickness newly deposited during the step illustrated in FIG. 4A.

During this deposition step, a second growth layer portion 210, of thickness $e_{210c}$ is deposited on the non-monocrystalline pattern 200.

During this second sequence, a second deposition step is carried out, consisting of depositing a semi-conductive material without the additional element or with a concentration of additional element, within the layer deposited, less than that of the first deposition of this second sequence.

Figure 4B:
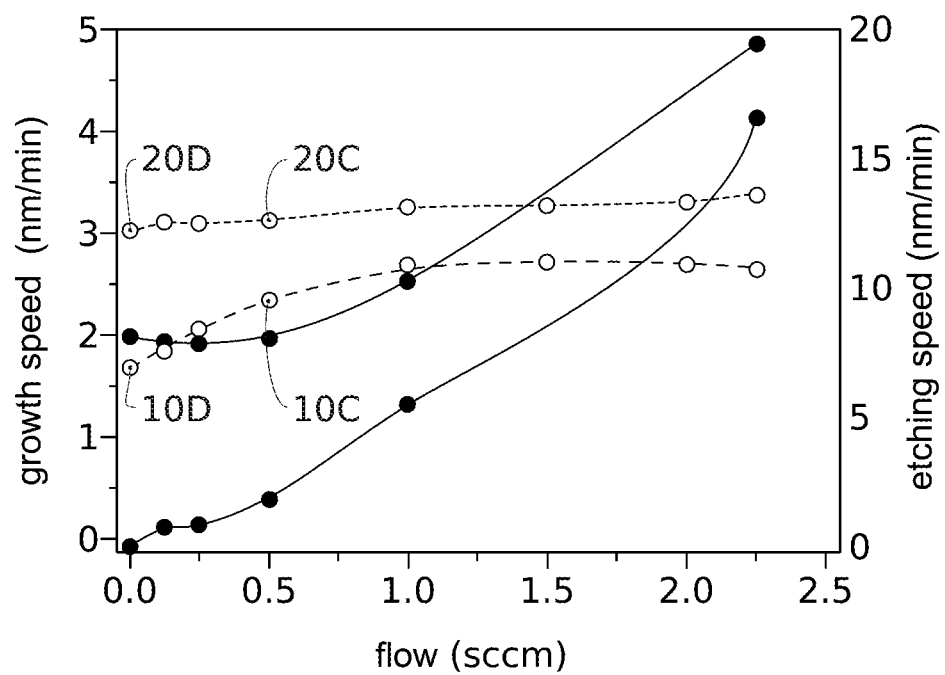
FIG. 4B returns to the graph of FIG. 2A, by mentioning the values retained for the flows of the additional species, on the one hand, for the first deposition, and on the other hand, for the second deposition illustrated in FIG. 4A.

As illustrated in the non-limiting example of FIG. 4B, this flow is zero (see references 10D and 20D). This second deposition therefore leads to the formation of the sacrificial layer made of non-doped Si.

This second deposition leads to the formation:
of the sacrificial layer 120, surmounting the monocrystalline pattern 100 and having the thickness $e_{120c}$, and
of the sacrificial layer 220, surmounting the non-monocrystalline pattern 200 and having the thickness $e_{220c}$.

This second deposition is followed by the etching step illustrated in FIG. 5A.

During this step, which preferably used the same etching chemistry as step 3A, the whole thickness $e_{220}$ and the whole thickness $e_{210}$ are etched of the layers 220 and 210 situated on the non-monocrystalline pattern 200, and the etching is stopped so as to fully or partially conserve the first growth layer portion 110 situated on the monocrystalline pattern 100.

The thickness of the first conserved growth layer portion 110 is referenced $e_{110d}$ in FIG. 5A.

The conditions of the first deposition, of the second deposition and of the etching of this second sequence are adjusted such that $e_{110d} > e_{110b}$. Thus, this second sequence allows to thicken the growth layer 110 obtained from the first sequence.

Figure 5B:
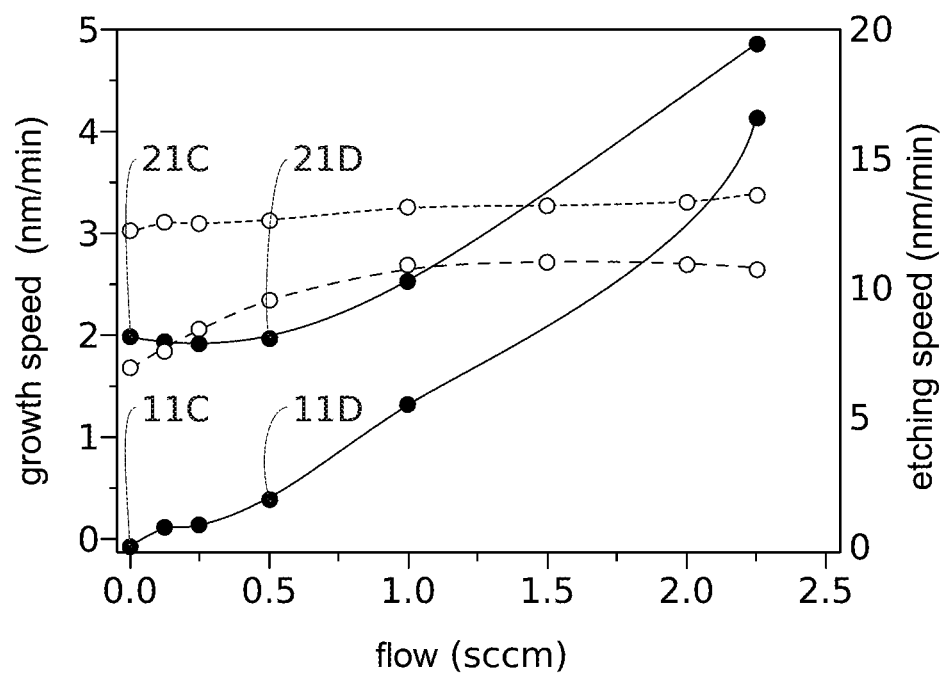
FIG. 5B returns to the graph of FIG. 2A, by mentioning the values applicable to the etching speeds for the etching step illustrated in FIG. 5A.

FIG. 5B illustrates the applicable etching speeds for the contents selected of additional species (see references 11C, 21C for the layers 120 and 220 and references 11D, 21D for the layers 110 and 210).

A third sequence of steps is illustrated in reference to FIGS. 6A to 7B.

Figure 6B:
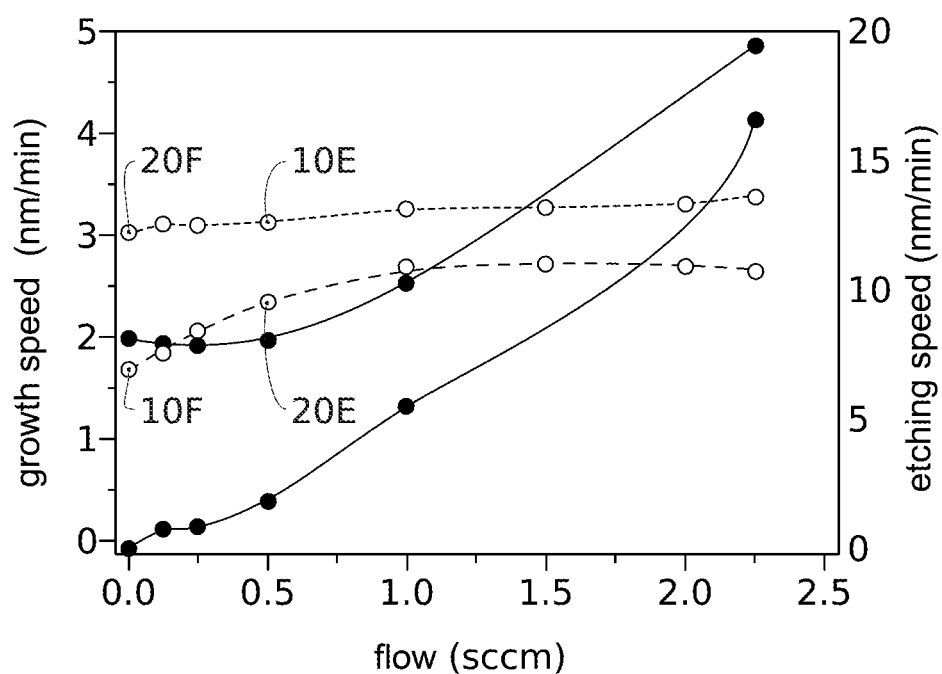
FIG. 6B returns to the graph of FIG. 2A, by mentioning the values retained for the flows of the additional species, on the one hand, for the first deposition, and on the other hand, for the second deposition illustrated in FIG. 6A.

FIGS. 6A and 6B illustrate the first and second depositions of this third sequence. The first deposition of this third sequence leads to the thickening of the first growth layer portion 110 formed on the monocrystalline pattern 100. This layer 110 thus has a thickness $e_{110e} > e_{110d}$.

During this first deposition, the growth layer 210 is also formed on the non-monocrystalline pattern 200.

This first deposition is carried out under the conditions illustrated by the references 10E and 20E in FIG. 6B: the $PH_3$ flow is equal to 0.5 sccm.

The second deposition of this third sequence leads to the formation of the sacrificial layers 120 and 220.

This second deposition is carried out under the conditions illustrated by the references 10F and 20F in FIG. 6B: the $PH_3$ flow is zero.

This second deposition is followed by the etching step illustrated in FIG. 7A.

During this step, which preferably uses the same etching chemistry as step 3A, the whole thickness $e_{220e}$ and the whole thickness $e_{210e}$ of the layers 220 and 210 situated on the non-monocrystalline pattern 200 are etched, and the etching is stopped so as to fully or partially conserve the first growth layer portion 110 situated on the monocrystalline pattern 100.

The thickness of the conserved growth layer 110 is referenced $e_{110f}$ in FIG. 7A.

The conditions of the first deposition, of the second deposition and of the etching of this third sequence are adjusted such that $e_{110f} > e_{110d}$. Thus, this third sequence allows to thicken the first growth layer portion 110 obtained from the second sequence.

Figure 7B:
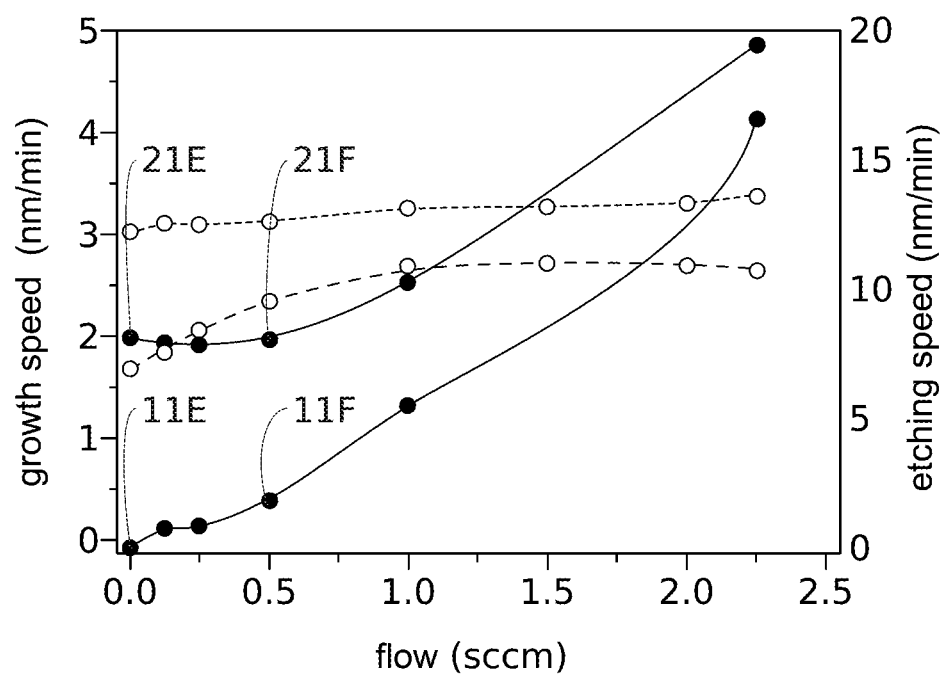
FIG. 7B returns to the graph of FIG. 2A, by mentioning the values applicable to the etching speeds for the etching step illustrated in FIG. 7A.

FIG. 7B illustrates the applicable etching speeds for the contents selected of additional species (see references 11E, 21E for the layers 120 and 220 and references 11F, 21F for the layers 110 and 210).

Optionally, from the etching of the last sequence, an over-etching step can be carried out in order to ensure that all of the second growth layer portion 210 surmounting the non-monocrystalline pattern 200 is actually removed. To this end, an etching based on a $Cl_2$-type chemistry can be provided.

Alternatively, an additional over-etching step can happen. In this case, the duration of etching of the last sequence can be extended.

In view of the description above, it clearly appears that the invention offers a simple and easily reproducible solution to form a semi-conductive layer, doped or added from an element, on a monocrystalline pattern, without forming this layer on a non-monocrystalline pattern.

Several variants can be applied to the non-limiting embodiments described in the paragraphs above in reference to FIGS. 1A to 7A.

For example, it can be provided that the semi-conductive element used for the first deposition is different from the semi-conductive element used for the second deposition. Thus, growth layers 110, 210 with the basis of a first semi-conductive element and sacrificial layers 120, 220 with the basis of a second semi-conductive element can be had. As an example, the growth layers 110, 210 can be silicon layers doped or added from an element and the sacrificial layers 120, 220 can be germanium or silicon-germanium layers (intrinsic or having a lesser concentration of doping agents or of additional elements).

Moreover, the duration of the deposition and etching steps can be fixed or variable from one sequence to the other. Thus, it can be provided to deposit layers of different thicknesses according to the different sequences.

Likewise, the content of additional species (typically doping agents) can vary from one sequence to the other.

Naturally, the precursors used for the first and second depositions can be adapted according to the growth layer that is sought to be deposited. The precursors are selected according to the temperatures possible for the deposition.

Typically, the temperature range for the implementation of the method according to the invention is comprised between 150° C. and 750° C. and preferably between 250° C. and 600° C.

The silicon precursors can, for example, be all composed of $Si_nH_{2+2n}$ type, n being an integer or dichlorosilane (DCS).

The germanium precursors can, for example, be $GeH_4$ or $Ge_2H_6$.

The boron precursors (B) can, for example, be $B_2H_6$.

The phosphorus precursors (P) can, for example, be $PH_3$.

The invention is not limited to the embodiments described above and extends to all the embodiments covered by the claims.

The invention claimed is:

1. A method for forming a layer by cycled epitaxy comprising the following steps:
    providing a wafer comprising at least one first monocrystalline pattern and at least one second pattern taken from among an amorphous pattern and a polycrystalline pattern,
    carrying out at least one sequence of steps each comprising at least the following successive steps:
    a first deposition so as to form,
        a first semi-conductive growth layer portion, formed by epitaxy on the first pattern and having a first thickness, and
        a second semi-conductive growth layer portion, formed on the second pattern and having a second thickness,
    at least due to a crystalline structure difference between the first and second patterns, coming from the first deposition, the second thickness being greater than the first thickness,
    the first deposition being carried out from a first chemistry comprising a first semi-conductive species and an additional species having in the first chemistry, a first content t1;
    a second deposition so as to form:
        a first semi-conductive sacrificial layer portion, formed by epitaxy on the first growth layer portion and having a third thickness, and
        a second semi-conductive sacrificial layer portion, formed on the second growth layer portion and having a fourth thickness,
    the second deposition being carried out from a second chemistry comprising a second semi-conductive species and having a second content t2 of said additional species, such that 0<t2<t1; and
    etching of the whole fourth thickness of the second sacrificial layer portion, of the whole third thickness of the first sacrificial layer portion and at least some of the second thickness of the second growth layer portion with stopping of the etching before having consumed the whole first thickness of the first growth layer portion.

2. The method according to claim 1, wherein said first semi-conductive species and said second semi-conductive species are identical.

3. The method according to claim 1, wherein said first semi-conductive species and said second semi-conductive species are different.

4. The method according to claim 1, wherein conditions of the first and second depositions, in particular the first content t1 and the second content t2, as well as conditions of the etching being adjusted such that:
    an etching speed of the second sacrificial layer portion is greater than k times an etching speed of the first sacrificial layer portion, k being greater than or equal to 2, and
    the third thickness of the first sacrificial layer portion formed by the second deposition is sufficient such that, after said etching, at least one portion of the first thickness of the first growth layer portion deposited on the first pattern subsists, such that, after etching, the first thickness is greater than zero and the first thickness is greater than the second thickness.

5. The method according to claim 1, wherein the first growth layer portion and the second growth layer portion are layers with a basis of one from among silicon and germanium, the first sacrificial layer portion and the second sacrificial layer portion being also layers with the basis of one from among silicon and germanium.

6. The method according to claim 1, wherein the additional species is a doping agent.

7. The method according to claim 6, wherein the additional species is taken from among phosphorus (P), boron (B), arsenic (As) and antimony (Sn).

8. The method according to claim 1, wherein the second content t2 is zero.

9. The method according to claim 1, wherein the first growth layer portion and the second growth layer portion are made of phosphorus-doped silicon (Si:P) and the first sacrificial layer portion and the second sacrificial layer portion are made of silicon (Si).

10. The method according to claim 1, wherein the first growth layer portion and the second growth layer portion are made of boron-doped silicon-germanium (SiGe:B) and the first sacrificial layer portion and the second sacrificial layer portion are made of silicon-germanium (SiGe).

11. The method according to claim 1, wherein the first thickness of the first growth layer portion and the second thickness of the second growth layer portion are comprised between 2 nm and 100 nm.

12. The method according to claim 1, wherein the third thickness of the first sacrificial layer portion and the fourth thickness of the second sacrificial layer portion are comprised between 2 nm and 50 nm.

13. The method according to claim 1, wherein the etching is configured to etch the whole second thickness and the whole fourth thickness, the etching being also configured such that after etching of the whole second thickness and of the whole fourth thickness, the whole first thickness of the first growth layer portion deposited on the first pattern remains.

14. The method according to claim 1, wherein a first etching speed of the first sacrificial layer portion, a second etching speed of the second growth layer portion, a third etching speed of the second sacrificial layer portion, and the first and third thicknesses are selected such that, after etching of the whole second thickness and of the whole fourth thickness, the whole first thickness of the first growth layer portion deposited on the first pattern remains.

15. The method according to claim 1, wherein, after the first deposition and after the second deposition, during said etching, the whole second thickness of the second growth layer portion is also etched.

16. The method according to claim 1 comprising a plurality of sequences, and wherein the whole second thickness of the second growth layer portion is etched only during the etching of a last one of said plurality of sequences.

17. The method according to claim 1, wherein the method comprises, after having carried out the at least one sequence of steps, a final etching step configured to remove a possible residue of the second growth layer portion.

18. The method according to claim 17, wherein the final etching step is based on a chlorine (Cl)-based chemistry.

19. The method according to claim 1, wherein said sequence of steps is repeated at least twice.

20. The method according to claim 1, wherein:
the first thickness of the first growth layer portion and the second thickness of the second growth layer portion are comprised between 2 nm and 50 nm, and
the third thickness of the first sacrificial layer portion and the fourth thickness of the second sacrificial layer portion are comprised between 2 nm and 20 nm.

21. The method according to claim 1, wherein:
the first deposition forms the first semi-conductive growth layer portion using a first etch rate and a first growth rate and forms the second semi-conductive growth layer portion using a second etch rate and a second growth rate,
the second deposition forms the first semi-conductive sacrificial layer portion using a third etch rate and a third growth rate and the second semi-conductive sacrificial layer portion, using a fourth etch rate and a fourth growth rate, and
a first ratio of the second etch rate to the first etch rate and a second ratio of the fourth etch rate to the third etch rate are each greater than a third ratio of the fourth growth rate to the third growth rate.

* * * * *